SEMICONDUCTOR DEVICE FABRICATION

Filed Aug. 30, 1963

INVENTORS
LEON S. GREENBERG
BY WILLIAM J. GREIG
W.S. Hill
AGENT

INVENTORS
LEON S. GREENBERG
BY WILLIAM J. GREIG

W. S. Hill
AGENT

Oct. 25, 1966 L. S. GREENBERG ETAL 3,281,291

SEMICONDUCTOR DEVICE FABRICATION

Filed Aug. 30, 1963 3 Sheets-Sheet 3

INVENTORS
LEON S. GREENBERG
BY WILLIAM J. GREIG

W. S. Hill
AGENT

United States Patent Office 3,281,291
Patented Oct. 25, 1966

3,281,291
SEMICONDUCTOR DEVICE FABRICATION
Leon S. Greenberg, Kingston, Pa., and William J. Greig, Somerville, N.J., assignors to Radio Corporation of America, a corporation of Delaware
Filed Aug. 30, 1963, Ser. No. 305,624
6 Claims. (Cl. 148—187)

This invention relates to improved methods of fabricating multijunction semiconductor devices, and more particularly to improved methods of introducing rectifying barriers into a semiconductive wafer.

Many types of semiconductor junction devices are fabricated from a slice or wafer of given conductivity type crystalline semiconductive material having two opposing major faces, by heating the wafer in an ambient containing a conductivity type-determining substance capable of imparting opposite conductivity type to the particular semiconductor employed. The ambient is usually a vapor, but may be a liquid, or a powdered solid containing a doping agent, as described in U.S. Patent 2,870,050, issued January 20, 1959 to C. W. Mueller and J. M. Printon, and assigned to the assignee of this application. The conductivity type-determining substance, which is also known in the art as an impurity or a doping agent or a conductivity type modifier, may be either an acceptor or a donor, and diffuses from the ambient into the semiconductive body to a depth determined by the temperature and duration of heating, as well as by the concentration of the impurity source and the diffusion constant of the impurity in the particular semiconductor. Since a surface layer of the semiconductive body is thereby converted to opposite conductivity type, a rectifying barrier known as a p-n junction is formed at the interface between the given conductivity type bulk of the wafer and the impurity-diffused surface layer. If the edges of the wafer or slice are now cut off, the remainder has a triple-layer double-junction PNP or NPN structure, which is readily formed into junction devices such as triode transistors by techniques known to the art. See, for example, Transistor Technology, Volumes I–III, D. Van Nostrand Company, Inc., New York, 1958. However, the two converted layers thus formed adjacent opposite major faces of the wafer or slice are both of the same thickness, surface concentration, and doping gradient.

In the fabrication of some types of semiconductor multijunction devices, it is desirable to prepare triple-layer double-junction semiconductor wafers which are unsymmetrical in that the converted layers adjacent opposite major wafer faces differ in respect to thickness or surface conductivity (surface impurity concentration), and doping gradient (or conductivity gradient). Such structures have hitherto been fabricated by two separate diffusion steps. For example, a given conductivity type wafer having two opposing major faces is heated in an ambient including an opposite conductivity type modifier under such conditions of temperature and modifier concentration as to form a heavily doped opposite conductivity type zone immediately adjacent each of the two opposing major wafer faces. The wafer is then lapped or etched on one major face only, to remove the heavily doped zone adjacent the one major face and expose the original wafer material therebeneath. Next, the wafer is reheated in an ambient including the aforesaid opposite conductivity type modifier, but under such conditions of lesser temperature, or lesser modifier concentration, or both, as to form adjacent the exposed wafer surface an opposite conductivity type semiconductor region which is less heavily doped and has a lower surface conductivity than the originally formed layer adjacent the other major wafer face. However, this procedure has several drawbacks. First, it requires additional handling steps, such as the lapping or etching step, and the second diffusion step, which tend to increase both the scrap rate and the production cost. Second, it is difficult to control accurately the two junction depths and the two conductivity gradients, since the junction first formed tends to move deeper into the wafer during the second heating step. Third, the concentration of the modifier in the first diffused region tends to change in a variable manner as a result of the second diffusion step.

It is an object of this invention to provide improved methods of fabricating improved semiconductor devices.

Another object of this invention is to provide an improved method of introducing rectifying barriers into semiconductive wafers.

Still another object of this invention is to provide an improved method of forming adjacent to opposing faces of a given conductivity type semiconductive wafer regions of opposite conductivity type which differ in respect to surface concentration.

But another object is to provide an improved method of forming adjacent to opposing faces of a given conductivity type wafer regions of opposite conductivity type which differ in respect to conductivity gradient.

These and other objects of the invention are attained by a process of introducing rectifying barriers into semiconductive wafers which comprises the steps of depositing on opposing major faces of a semiconductive wafer coatings of silicon oxide containing a conductivity modifier, the concentration of said modifier being higher in the coating on one said face than in the coating on the other said face, and then heating the wafer to diffuse the modifier from the coatings into the wafer.

The invention will be described in greater detail with the accompanying drawing, in which.

A method of applying a doped silicon oxide coating to a semiconductive body, and apparatus useful for this purpose, will now be described.

DESCRIPTION OF ONE APPARATUS

Figure 1:
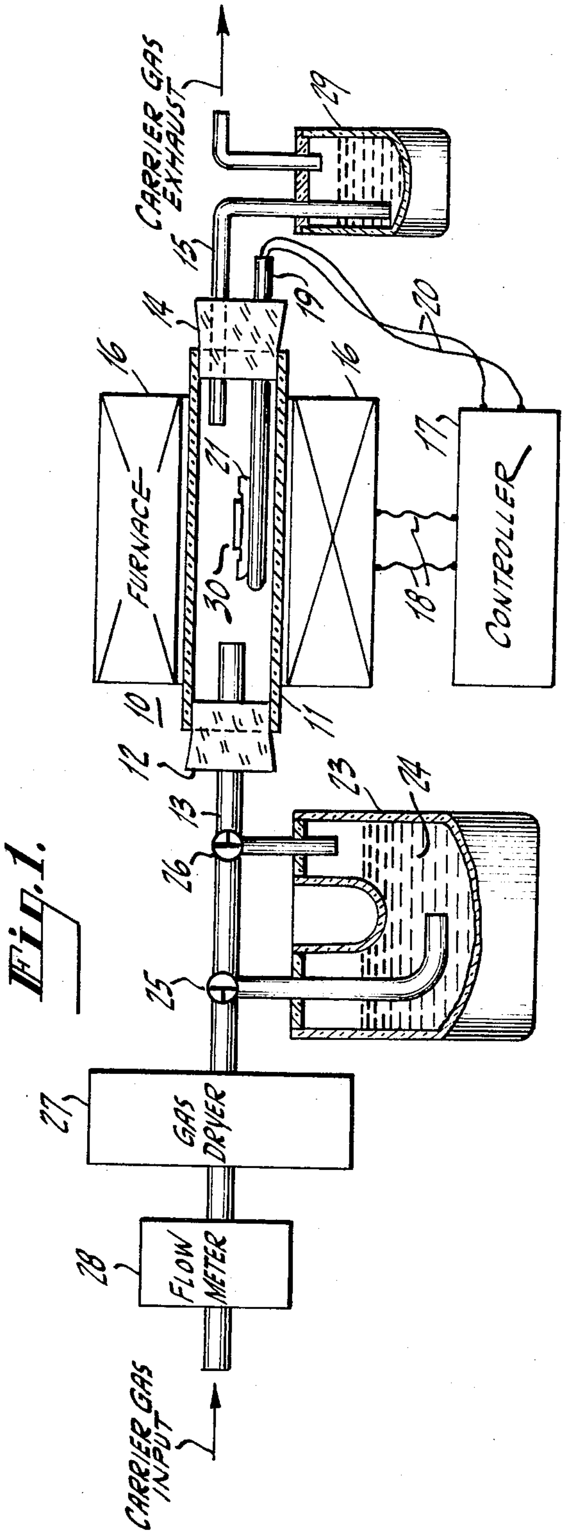
FIGURE 1 is a cross-sectional schematic view of one form of apparatus useful in the practice of the invention.

One form of apparatus useful in the practice of the invention is illustrated in FIGURE 1 and described in U.S. Patent No. 3,089,793, issued to Jordan and Donahue on May 14, 1963 and assigned to the assignee of this application. The apparatus 10 comprises a refractory furnace tube 11 which may, for example, consist of a high melting glass, or of fused silica, or the like. Furnace tube 11 has at one end a stopper 12 containing an inlet tube 13, and at the other end a stopper 14 containing an outlet tube 15. Around a central portion of furnace tube 11 is a furnace 16, which may, for example, be an electrical resistance furnace. Advantageously, the temperature of furnace 16 is kept within the desired temperature range by means of a controller 17, which is connected by a pair of electrical lead wires 18 to the furnace 16. Furnace tube 11 contains a quartz temperature-sensing element 19 which is mounted in outlet stopper 14. The temperature-sensing element 19 contains a temperature-sensing device such as a thermocouple (not shown) which is connected by a pair of electrical lead wires 20 to the controller 17. A holder 21 is supported by the temperature-sensing element 19. The semiconductor wafer 30 to be treated is placed on the holder 21. A gas bubbler 23 feeds into the inlet tube 13. The bubbler 23 contains a liquid 24 consisting of an organic siloxane compound in which is dissolved a substance that modifies the conductivity type of the particular semiconductor being processed, that is, a substance which is a suitable doping agent for the particular semiconductor. Inlet tube 13 also includes stopcocks 25 and 26 in the entrance and exit respectively of bubbler 23. The bubbler 23 may thus be by-passed when desired by means of stopcocks 25 and 26. Ahead of the bubbler 23 in the gas train is a gas dryer 27 and a flowmeter 28 for controlling the flow of the inert carrier gas which is introduced into the bubbler 23 from gas source (not shown), which may be a tank or a line. The outlet tube 15 leads to a gas scrubber 29. The carrier gas is passed through the apparatus 10 in the direction indicated by the arrows, and leaves scrubber 29 by way of the exhaust. Suitably, the inlet tube 13 the outlet tube 15, the holder 21 and the scrubber 29 are all made of a refractory material such as fused quartz.

*Example I*

Figure 3:
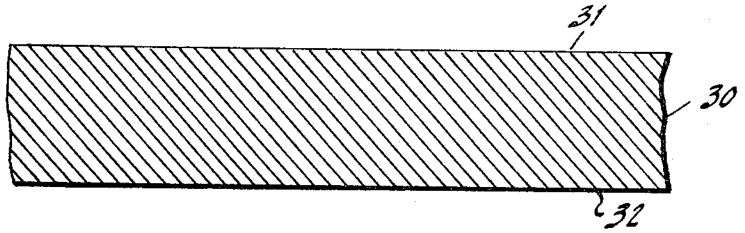
FIGURES 3–7 are cross-sectional views of a semiconductive wafer during successive steps in the fabrication of a semiconductor structure according to one embodiment of the invention.

Referring now to FIGURE 3, a slice or wafer 30 of crystalline semiconductive material is prepared with two opposing major faces 31 and 32. The exact dimensions and conductivity of wafer 30 are not critical in the practice of the invention. In this example, wafer 30 is a slice of an N-type monocrystalline silicon ingot, is about 10 mils thick, and has a resistivity of about 20–40 ohm-cm.

An acceptor-doped silicon oxide coating is deposited on semiconductive wafer 30, using the apparatus described above, as follows. The semiconductive wafer 30, which in this example consists of N-type silicon, is etched, cleaned, dried, then positioned on holder 21 and introduced into furnace tube 11. Furnace tube 11 is stoppered and suitably positioned in furnace 16. In this example, the furnace control 17 is set to maintain the temperature inside furnace tube 11 at about 730° C. Most organic siloxane compounds begin to decompose at about 600° C. The inert carrier gas utilized may, for example, be nitrogen, argon, helium, or the like. Hydrogen and hydrogen-nitrogen mixtures known as forming gas may also be utilized as the carrier gas. In this example, the carrier gas consists of argon, the liquid siloxane compound 24 in bubbler 23 consists of ethyl silicate, and the conductivity type modifier or doping agent dissolved therein consists of trimethylborate. The proportions of the siloxane compound and the conductivity modifier may be varied to obtain different concentrations of the doping agent or active impurity in the silicon oxide layers deposited. In this example, the liquid 24 inside bubbler 23 consists of 10 milliliters ethyl silicate and 1 milliliter triethylborate.

Figure 4:
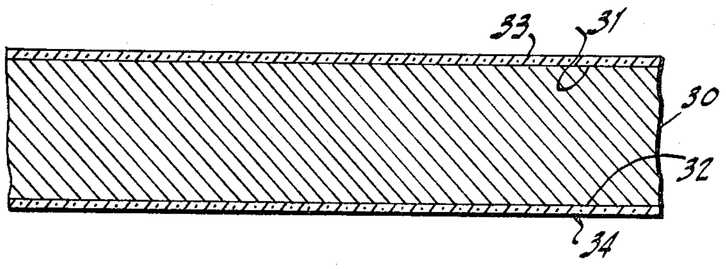

Line argon is passed through the system at the rate of about two cubic feet per hour while the furnace 16 is warmed to the desired temperature. During this period, the bubbler 23 is bypassed. When the temperature inside furnace tube 11 has reached 730° C., the flow of argon is switched by means of stopcocks 25 and 26 so as to bubble through the doped siloxane liquid 24. The mixed vapors of ethyl silicate and trimethylborate are swept by the argon through the inlet tube 13 into the furnace tube 11, where they are decomposed. A layer or coating of boron-containing silicon oxide 33 (FIGURE 4) is thus deposited on major face 31 of wafer 30, and a similar silicon oxide coating 34 (FIGURE 4) is deposited on major face 32. The carrier gas and the remaining decomposition products leave the system by way of the exhaust. After about 10 to 20 minutes of deposition of the boron-doped silicon oxide layers, the flow of the carrier gas is switched back by means of stopcocks 25 and 26, that is, the bubbler 23 is again bypassed, and the furnace 16 is shut off. When the temperature inside the furnace tube 11 drops to about 200° C., the flow of the carrier gas may be turned off completely, and the wafer 30 removed from the furnace tube 11.

Figure 5:
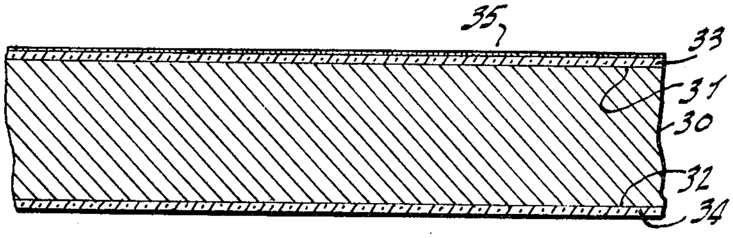

Referring now to FIGURE 5 of the drawing, the concentration of boron in only one of the silicon oxide layers 33 and 34 is increased. In this example, the surface of silicon oxide layer 33 is painted with a solution of a boron compound, such as boric acid, dissolved in a suitable solvent, such as Cellosolve. A boron-containing film 35 is thus formed on the surface of the boron-doped silicon oxide layer 33.

Figure 6:
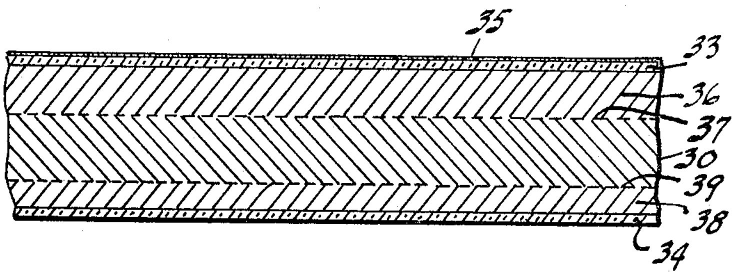

The wafer 30 is now heated at about 1300° C. for about 14 hours so as to diffuse boron from the two silicon oxide coatings 33 and 34 into the adjacent portions of wafer 30. A wafer region 38 (FIGURE 6) adjacent wafer face 32 is thus converted to P conductivity type, and a p-n junction 39 is formed between the P type region 38 and the N type bulk of wafer 30. At the same time, a wafer region 36 (FIGURE 6) adjacent wafer face 31 is converted to P+ conductivity, and a p-n junction 37 is formed between the P type wafer region 36 and the N type bulk of wafer 30. The two boron-diffused wafer regions 36 and 38 are unsymmetrical. Wafer region 36 is more heavily doped than wafer region 38, has a higher surface concentration of boron, and a steeper conductivity gradient, because the boron diffusion source on face 31 of the wafer was made more concentrated by the presence of film 35 than the boron diffusion source on face 32 of the wafer. In this example, wafer region 36 is about 2.5 mils thick, and has a surface concentration of about $10^{21}$ boron atoms per $cm.^3$, while wafer region 38 is about 1.8 mils thick and has a surface concentration of about $2 \times 10^{18}$ boron atoms per $cm.^3$. The steepness of the conductivity gradient in region 36 is shown by the decline in boron atom concentration in region 36 from $10^{21}$ atoms per $cm.^3$ at the surface to about $10^{14}$ atoms per $cm.^3$ at the junction 37.

Figure 7:
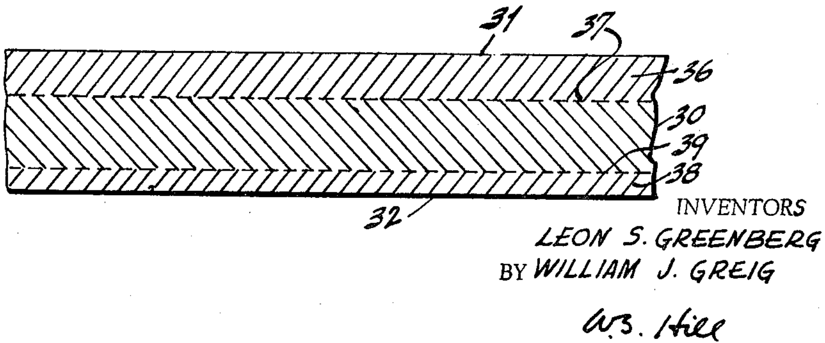

The silicon oxide layers 33 and 34, together with what remains of boron oxide layer 35, are now removed by etching the wafer in hydrofluoric acid, leaving the wafer as shown in FIGURE 7, with a P+NP structure. Wafer 30 may now be cut into dies or pellets, each containing a P+ and a P type layer on opposite sides of an N type layer. The individual dies are readily formed into semiconductor junction devices, such as triode transistors, by attaching electrical leads to each die region, and encapsulating the die by methods known to the art.

One advantage of this method is that the p-n junctions formed in the semiconductor wafer are uniform and planar. Another advantage is that the concentration of impurity material on the wafer surface is reproducible. Still another advantage is that the silicon oxide layers prevent or minimize cross-contamination of one wafer surface by another.

DESCRIPTION OF ALTERNATE APPARATUS

Alternatively, an organic siloxane compound may be thermally decomposed, and the decomposition products of the compound forced through a jet so as to impinge upon and coat a semiconductive body with silicon oxide. A special utility of this method is that it requires only moderate heating of the semiconductive body. The method for forming a doped silicon oxide coating on a semiconductive body at moderate temperatures, and apparatus useful for this purpose, will now be described.

Figure 2:
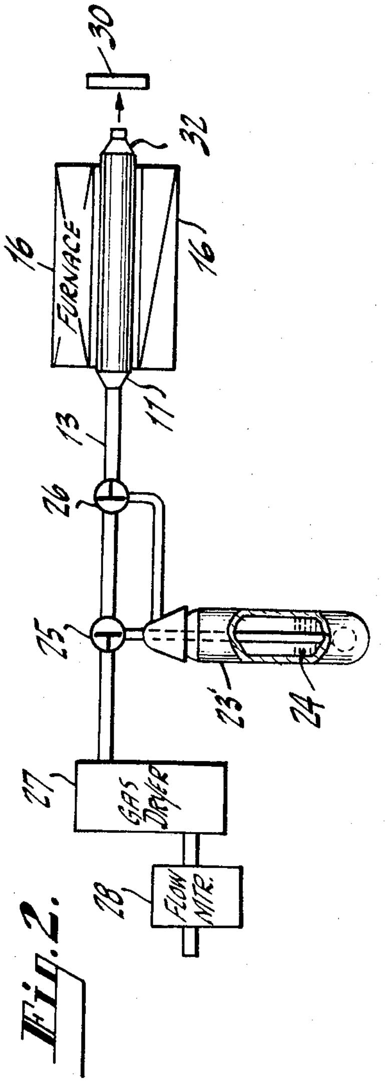
FIGURE 2 is a cross-sectional schematic view of another form of apparatus useful in the practice of the invention.

An alternative form of apparatus useful in the practice of the invention is illustrated in FIGURE 2. The apparatus 10' comprises a flow meter 28 for regulating the flow of the carrier gas, a drying column 27 for purification of the carrier gas, and an inlet tube 13 provided with stopcocks 25 and 26 for bypassing a bubbler 23'. The bubbler 23' of this example is somewhat different in form from that described above in connection with FIGURE 1, but contains a similar liquid mixture 24 consisting of an organic siloxane compound together with a doping agent, and functions in a similar manner. The organic siloxane compound may, for example, consist of ethyl triethoxysilane. Inlet tube 13 is attached to one end of furnace tube 11. The tube 11 is surrounded by furnace 16, which is maintained at about 700° C. Since siloxane compounds generally begin to decompose at about 600° C., the furnace temperature of 700° C. is sufficient to insure pyrolysis of siloxane vapors introduced into the furnace. The mixed vapors of the inert carrier gas, the doping agent, and the thermal decomposition products of the siloxane compound exit from the other end of furnace tube 11 by way of a jet 22, and the jet stream (not shown) thus formed impinges upon the semiconductive wafer 30. The jet stream cools off rapidly as it leaves the jet 22, and hence the temperature of the jet stream at the point where it impinges on the semiconductive wafer 30 may be varied by adjusting the distance between the jet or orifice 22 and the wafer 30. For a furnace temperature of about 700° C., and a separation between jet 22 and wafer 30 of about 2 millimeters, the temperature of the jet impinging upon the wafer is about 150° C. Doped silicon oxide coatings can be deposited by this technique on semiconductive wafers while maintaining the wafer at very moderate temperatures. This technique is particularly useful with low energy gap semiconductors, which cannot withstand high temperatures.

Other embodiments of the fabrication of semiconductor junction devices in accordance with the principles of the invention will now be described.

*Example II*

Referring now to FIGURE 3 of the drawing, a wafer 30 of crystalline semiconductive material is prepared with two opposing major faces 31 and 32, respectively. In this example, wafer 30 consists of a P type monocrystalline germanium-silicon alloy. Monocrystalline germanium-silicon alloys and their preparation are described in U.S. Patent 2,997,410, issued August 22, 1961, to B. Selikson, and assigned to the assignee of this application.

Figure 8:
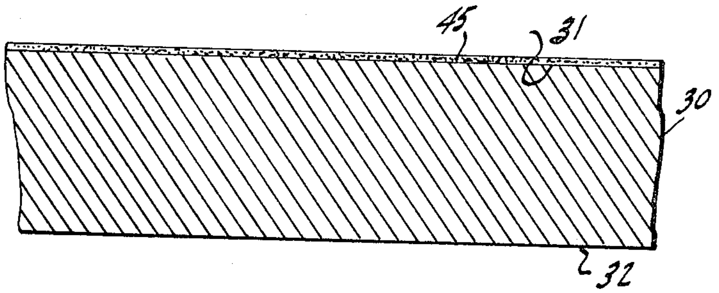
FIGURES 8 and 9 are cross-sectional views of a semiconductive wafer during successive steps in the fabrication of a semiconductor structure according to another embodiment of the invention; and, FIGURES 10 and 11 are cross-sectional views of a semiconductive wafer during successive steps in the fabrication of a semiconductor structure according to still another embodiment of the invention.
Figure 9:
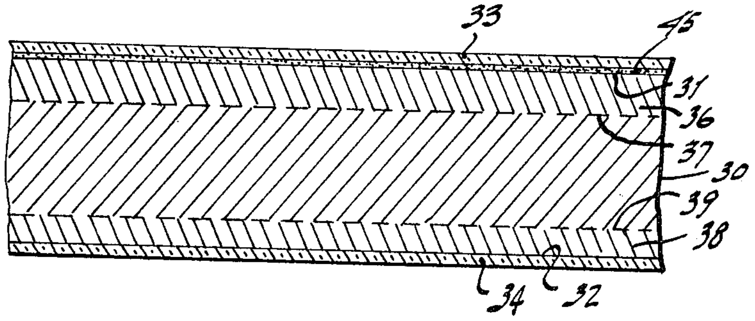

One major wafer face 31 is painted with a solution of a phosphorus compound, such as phosphoric acid anhydride ($P_2O_5$) dissolved in an organic solvent such as Cellosolve. A phosphorus-containing film 45 (FIGURE 8) is thus formed on major face 31 of the wafer 30. The wafer 30 is then treated to deposit donor-doped silicon oxide layers 33 and 34 as in FIGURE 9 on wafer faces 31 and 32, respectively. This may be accomplished as described in Example I by means of the apparatus described in FIGURE 1, by utilizing for the doped siloxane liquid 24 a mixture of ten milliliters ethyl silicate and one milliliter trimethyl phosphate. Alternatively, the donor-doped silicon oxide layers 33 and 34 may be deposited by means of the apparatus of FIGURE 2 by presenting each major face 33 and 34 to the jet for an equal time.

The remaining steps are similar to those described in Example I. The wafer 30 is heated in a hydrogen atmosphere at about 1100° C. for about 30 minutes. During this step, phosphorus diffuses from film 45 and silicon oxide layers 33 and 34 into wafer faces 31 and 32, respectively, forming phosphorus diffused regions 36 and 38 (FIGURE 9), respectively. At the interface between the phosphorus-diffused regions 36 and 38 and the bulk of wafer 30, p-n junctions 37 and 39, respectively, are formed. The silicon oxide layers 33 and 34 and the phosphorus-containing film 45 are then removed by washing the wafer in hydrofluoric acid, leaving the wafer as in FIGURE 7. A triple-layer double-junction structure is thus formed which is the inverse of that of Example I above, since, in this example, region 36 is of N+ conductivity, region 30 is of P type conductivity, and region 38 is of N type conductivity. The two phosphorus-diffused regions 36 and 38 are unsymmetrical, since wafer face 31 was painted with phosphoric acid anhydride, and hence region 36 was diffused from a more concentrated phosphorus source than region 38. Accordingly, wafer region 36 is more heavily doped than wafer region 38, has a higher surface concentration of phosphorus, and has a steeper conductivity gradient. Wafer 30 may now be cut into dies, each containing an N+ and an N type layer on opposite sides of a P type layer, and the dies formed into semiconductor junction devices by standard techniques of the semiconductor art.

*Example III*

Figure 10:
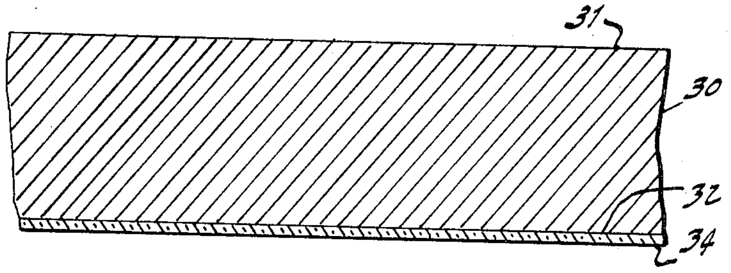

A wafer 30 (FIGURE 3) of given conductivity type crystalline semiconductive material is prepared with two opposing major faces 31 and 32, respectively. A silicon oxide layer 34 (FIGURE 10) containing an opposite conductivity type modifier is deposited on major wafer face 32, only, by means of the apparatus described above in connection with FIGURE 2, by positioning wafer face 32 to face the jet 22. The amount of doping agent in the liquid mixture 24 (FIGURE 2) is then increased, for example by doubling the ratio of conductivity modifier to siloxane compound in the mixture 24, and wafer face 31 is positioned to face jet 22. A doped silicon oxide layer 33 (FIGURE 11) is then deposited on wafer face 31 only. However, the concentration of the doping agent in the silicon oxide layer 33 is greater than the concentration of the same doping agent in silicon oxide layer 34.

Figure 11:
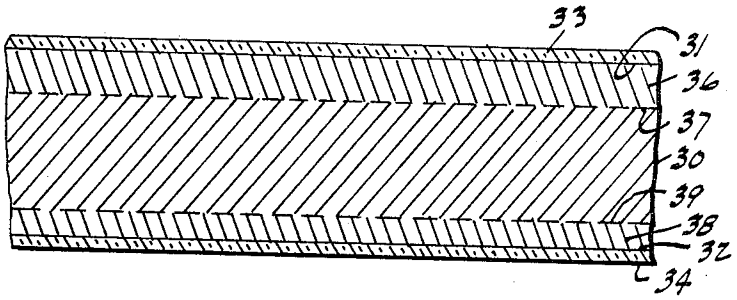

Wafer 30 is then heated for a time and temperature sufficient to diffuse some of the doping agent from the silicon oxide layers 33 and 34 into wafer regions 36 and 38, respectively (FIGURE 11). The diffused regions 36 and 38 are immediately adjacent wafer faces 31 and 32, respectively. Regions 36 and 38 are thus converted to conductivity type opposite that of the wafer, and hence rectifying barriers or p-n junctions 37 and 39 are formed at the interfaces between wafer regions 36 and 38 respectively and the bulk of the wafer.

After the silicon oxide layers 33 and 34 are removed by washing the wafer in hydrofluoric acid, wafer 30 is left as in FIGURE 7. The two diffused regions 36 and 38 are unsymmetrical, since region 36 was diffused from a more concentrated source than region 38. Accordingly, wafer region 36 is more heavily doped than wafer region 38, has a higher surface concentration of the modifier or doping agent, and has a steeper conductivity gradient. The remaining steps of cutting wafer 30 into dies, and forming the dies into semiconductor junction devices, are accomplished by any convenient method known to the art.

*Example IV*

According to another embodiment of the invention, a slice or wafer 30 (FIGURE 8) of given conductivity type crystalline semiconductive material is prepared with two opposing major faces 31 and 32. In this example, wafer 30 consists of N type monocrystalline silicon. One major wafer face 31 is painted with a saturated solution of boric acid in Cellosolve (ethylene glycol monomethyl ether). Wafer 30 is next heated to a temperature above 1000° C. for a period of time just long enough to form a borosilicate glaze 45 on wafer face 31. Wafer 30 is then waxed down on a glass plate or slide (not shown) with face 32 uppermost, and is lightly etched to remove any boron which may have reached this side of the wafer. The etched wafer is removed from the glass slide, washed, and dried.

Silicon oxide layers 33 and 34 (FIGURE 9) containing boron as the conductivity modifier are deposited, by means of either the apparatus described in connection with FIGURE 1 or the apparatus illustrated in FIGURE 2, on both sides (opposing major faces 31 and 32) of wafer 30. The coated wafer 30 (FIGURE 9) is then heated in hydrogen for about 14 hours at about 1300° C. As in the previous examples, modifier diffused regions 36 and 38 are formed adjacent the two opposing sides 31 and 32 respectively of the wafer. The silicon oxide layers 33 and 34 and the borosilicate glaze 45 are removed by washing the wafer in hydrofluoric acid, leaving the wafer as in FIGURE 7.

The two diffused regions are unsymmetrical, since the boron-diffused region on that side of the wafer which was painted with boric acid is thicker, has a higher surface concentration of boron, and has a steeper conductivity gradient than the boron-diffused region on the opposing side of the wafer. The structure thus formed may be processed as described above to form semiconductor junction devices.

While preferred forms of the invention have been described, it will be understood that the above examples are by way of illustration only and not limitation, since various modifications may be made by those skilled in the art without departing from the spirit and scope of the invention as described in the specification and appended claims.

What is claimed is:

1. The method of fabricating a semiconductor junction device, comprising the steps of:

preparing a given conductivity type crystalline semiconductive wafer with two opposing major faces;

depositing a silicon oxide layer on each said major wafer face, each said silicon oxide layer containing an opposite conductivity type modifier, the concentration of said modifier in one said silicon oxide layer being higher than in the other said layer;

and heating said wafer to diffuse said modifier from said silicon oxide layers only into the portions of said wafer immediately adjacent said silicon oxide layers and form two opposite conductivity type wafer regions adjacent said two opposing major faces, the conductivity of the opposite type wafer region immediately adjacent the silicon oxide layer with said higher concentration of said opposite conductivity-type modifier falling off more rapidly with increasing depth than the conductivity of the opposite type wafer region immediately adjacent the opposing wafer face.

2. The method of fabricating a semiconductor junction device, comprising the steps of:

preparing a given conductivity type crystalline semiconductive wafer with two opposing major faces;

depositing a silicon oxide layer on each said major wafer face, each said silicon oxide layer containing an opposite conductivity type modifier; increasing the concentration of said modifier in one said silicon oxide layers as compared to the other said silicon oxide layer;

and heating said wafer to diffuse said modifier from said silicon oxide layers only into the portions of said wafer immediately adjacent said silicon oxide layers and form two opposite conductivity type wafer regions adjacent said two opposing major faces, the conductivity of the opposite type wafer region immediately adjacent the silicon oxide layer with said higher concentration of said opposite conductivity-type modifier falling off more rapidly with increasing depth than the conductivity of the opposite type wafer region immediately adjacent the opposing wafer face.

3. The method of forming a semiconductor device, comprising the steps of:

depositing coatings of silicon oxide containing a conductivity modifier on opposing major faces of a semiconductive wafer, the concentration of said modifier being higher in said silicon oxide coating on one said wafer face than on the other said wafer face; and, heating said wafer to diffuse said modifier from said coatings into the portions of said wafer immediately adjacent said coatings.

4. The method of forming a semiconductor device, comprising the steps of:

depositing on opposing major faces of a given conductivity type semiconductive wafer coatings of silicon oxide containing a conductivity modifier of a type opposite the conductivity type of said wafer, the concentration of said modifier being higher in the silicon oxide coating on one said face than in the coating on the other said face; and, heating said wafer to diffuse said modifier from said coatings into the portions of said opposing wafer faces immediately adjacent said coatings.

5. The method of forming a semiconductor device, comprising the steps of:

depositing coatings of silicon oxide containing a conductivity modifier on opposing major faces of a semiconductive wafer;

increasing the concentration of said modifier in one said silicon oxide coating; and, heating said wafer to diffuse said modifier from said coatings into the portions of said wafer immediately adjacent said coatings.

6. The method of forming a semiconductor device comprising the steps of:

depositing on opposing major faces of a given conductivity type semiconductive wafer coatings of silicon oxide containing a conductivity modifier of a type opposite to the conductivity type of said wafer;

providing an increased amount of said opposite type conductivity modifier on one said wafer face relative to the other of said wafer faces; and, heating said wafer to diffuse said modifier from said coatings into the portions of said wafer immediately adjacent said coatings.

References Cited by the Examiner

UNITED STATES PATENTS

| | | | |
|---|---|---|---|
| 2,802,760 | 8/1957 | Derick | 148—189 |
| 3,084,079 | 4/1963 | Harrington | 148—187 |

OTHER REFERENCES

Jacobson: Encyclopedia of Chemical Reactions, vol. V, 1953, pp. 331 and 332.

HYLAND BIZOT, *Primary Examiner.*

BENJAMIN HENKIN, H. W. CUMMINGS, *Assistant Examiners.*